US007436057B2

(12) United States Patent
Long et al.

(10) Patent No.: US 7,436,057 B2
(45) Date of Patent: Oct. 14, 2008

(54) ELASTOMER INTERPOSER WITH VOIDS IN A COMPRESSIVE LOADING SYSTEM

(75) Inventors: David C. Long, Wappingers Falls, NY (US); William L. Brodsky, Binghamton, NY (US); Jason S. Miller, Poughkeepsie, NY (US); John G. Torok, Poughkeepsie, NY (US); Jeffrey A. Zitz, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 176 days.

(21) Appl. No.: 11/162,389

(22) Filed: Sep. 8, 2005

(65) Prior Publication Data

US 2007/0052111 A1 Mar. 8, 2007

(51) Int. Cl.
*H01L 23/12* (2006.01)
*H01L 21/00* (2006.01)
*H05K 1/14* (2006.01)

(52) U.S. Cl. .................. 257/701; 257/724; 257/727; 361/742; 361/747; 361/750; 361/758; 361/759; 438/107; 438/125

(58) Field of Classification Search ............... None
See application file for complete search history.

(56) References Cited

U.S. PATENT DOCUMENTS

| | | | |
|---|---|---|---|
| 5,059,129 A * | 10/1991 | Brodsky et al. | ............... 439/67 |
| 5,881,453 A | 3/1999 | Avery et al. | |
| 5,959,840 A | 9/1999 | Collins et al. | |
| 6,224,392 B1 | 5/2001 | Fasano et al. | |
| 6,258,627 B1 | 7/2001 | Benenati et al. | |
| 6,264,476 B1 * | 7/2001 | Li et al. | ............... 439/66 |
| 6,332,782 B1 | 12/2001 | Bezama et al. | |
| 6,386,890 B1 * | 5/2002 | Bhatt et al. | ............... 439/67 |
| 6,497,582 B1 | 12/2002 | Hoffmeyer | |
| 6,524,115 B1 * | 2/2003 | Gates et al. | ............... 439/66 |
| 6,545,226 B2 * | 4/2003 | Brodsky et al. | ............... 174/260 |
| 6,654,250 B1 | 11/2003 | Alcoe | |
| 6,657,313 B1 | 12/2003 | Brofman et al. | |
| 6,659,795 B1 | 12/2003 | Lai et al. | |
| 6,679,707 B1 | 1/2004 | Brodsky et al. | |
| 6,685,494 B1 | 2/2004 | McHugh et al. | |
| 6,692,279 B1 | 2/2004 | Ma | |
| 6,694,609 B2 | 2/2004 | Lopata et al. | |
| 6,711,026 B2 | 3/2004 | Hoffmeyer | |
| 6,716,050 B1 | 4/2004 | Ma et al. | |
| 6,719,580 B1 | 4/2004 | Ma | |
| 6,722,896 B2 | 4/2004 | McGrath et al. | |

(Continued)

*Primary Examiner*—Alonzo Chambliss
(74) *Attorney, Agent, or Firm*—DeLio & Peterson, LLC; Peter W. Peterson (57) ABSTRACT

An electronic module and a method of assembling the electronic module. A circuit board is connected to a chip substrate by an array of connectors, and a base member is on the side of the circuit board away from the chip substrate and connector array. An elastomeric structure is placed between the circuit board and the base member. The elastomeric structure has voids between a first defining plane adjacent the circuit board and a second defining plane adjacent the base member, with the voids adapted to permit local deformation of elastomeric material in the structure. The method includes applying a compressive force between the circuit board and base member to at least partially compressing the elastomeric structure to improve load equalization on the circuit board.

23 Claims, 7 Drawing Sheets

U.S. PATENT DOCUMENTS

| | | |
|---|---|---|
| 6,722,909 B1 | 4/2004 | McHugh et al. |
| 6,723,927 B1 | 4/2004 | Fan et al. |
| 6,726,500 B1 | 4/2004 | McHugh et al. |
| 6,731,516 B1 | 5/2004 | Ma |
| 6,776,625 B2 | 8/2004 | Ma |
| 6,780,041 B1 | 8/2004 | Ma |
| 6,799,978 B2 | 10/2004 | Ma et al. |
| 6,892,451 B2 * | 5/2005 | Brodsky et al. ............... 29/832 |
| 7,247,035 B2 * | 7/2007 | Mok et al. .................... 439/81 |
| 7,248,455 B2 * | 7/2007 | Brodsky et al. ............. 361/220 |
| 2005/0095884 A1 * | 5/2005 | Brodsky et al. ............... 439/91 |

* cited by examiner

ELASTOMER INTERPOSER WITH VOIDS IN A COMPRESSIVE LOADING SYSTEM

BACKGROUND OF THE INVENTION

1. Field of the Invention

The present invention relates to the manufacture of semiconductor devices and, in particular, to a system for ensuring uniform loading in semiconductor chip packaging.

2. Description of Related Art

Integrated circuit chips are typically mounted in electronic module assemblies that provide electronic connection to the chip circuits, cooling as the chips operate, and mechanical protection for the chips. In such electronic modules assemblies, the integrated circuit chips are seated on and electrically connected to an electrical interconnect or interposer substrate which provides electrical connection between the chip circuit on one side, and a connector grid array which provides electrical connection to a circuit board. This connector grid array typically uses solder interconnection such as ball grid arrays (BGA), or column gird arrays (CGA) or non-solder contact land grid arrays (LGA) that require a force of 30-100 grams per contact. This assembly is mechanically held between a heat removing structure or top hat which contacts the integrated circuit chips on the upper side, and a base member which contacts the circuit board on the lower side. Mechanical means such as threaded fasteners, springs and the like are used to force the top hat against the base member to firmly hold the electronic module assembly and provide good thermal contact between the top hat and the integrated circuit chips. The module base member may include a plastic insulator and, optionally, a shim-type spacer used to produce an even pressure load across the entire lower surface of the circuit board as the components flex under load. The load on a typical 3.6 in.×3.6 in. (9 cm×9 cm) electronic module assembly may be on the order of about 1000 lbs. (450 kg).

If there are excessive variations in the flatness or thickness of the individual components within the stack in the module assembly, there will result a non-uniform loading to the components thereof. This is of particular concern to LGA and other type electrical connection structures because of possible damage to the interconnections, and interruptions in electrical connection. A solution has been disclosed in U.S. Pat. No. 6,654,250, involving the use of a flat, thermally conductive conformal member made of a reinforced boron nitride filled silicone elastomer or a urethane product. This conformal member is placed between the chip and the heat sink and between the circuit board and the lower backing member. While the use of such conformal member makes loading more uniform, the elasticity is linear only up to a certain degree of compression, after which it diminishes considerably.

SUMMARY OF THE INVENTION

Bearing in mind the problems and deficiencies of the prior art, it is therefore an object of the present invention to provide a method and system for improving load equalization on the circuit board in an electronic module assembly and the connections associated therewith, particularly ball grid array connectors such as LGAs.

It is another object of the present invention to provide a method and system for improving load equalization in an electronic module assembly that may be utilized with existing electronic module configurations.

A further object of the present invention is to provide a method and system of reducing load variation or creep after the electronic module is assembled.

Another object of the present invention is to provide elasticity for load equalization in an electronic module assembly over a greater range of compression.

Still other objects and advantages of the invention will in part be obvious and will in part be apparent from the specification.

The above and other objects, which will be apparent to those skilled in the art, are achieved in the present invention which is directed to an electronic module assembly comprising a circuit board connected to a chip substrate by an array of connectors and a base member on the side of the circuit board away from the chip substrate and connector array. The assembly further includes an elastomeric structure between the circuit board and the base member, the elastomeric structure having voids between a first defining plane adjacent the circuit board and a second defining plane adjacent the base member. The voids are adapted to permit local deformation of elastomeric material in the structure upon compression thereof.

In another aspect, the present invention is directed to a method of assembling an electronic module comprising providing a circuit board connected to a chip substrate by an array of connectors, providing a base member on the side of the circuit board away from the chip substrate and connector array, and placing an elastomeric structure between the circuit board and the base member. The elastomeric structure has voids between a first defining plane adjacent the circuit board and a second defining plane adjacent the base member, with the voids adapted to permit local deformation of elastomeric material in the structure. The method further includes applying a compressive force between the circuit board and base member to at least partially compressing the elastomeric structure to improve load equalization on the circuit board.

The elastomeric structure may comprise an elastomeric layer having a first surface corresponding to the first defining plane and a second surface corresponding to the second defining plane, with the voids comprising openings, such as holes or trenches, in at least one surface of the elastomeric layer. The compressive force applied to the assembly at least partially compresses the elastomeric layer. The openings may extend completely through the elastomeric layer, so that they are also in both surfaces thereof. Whether on one or both surfaces, the openings may extend only partially through the elastomeric layer. The openings in the elastomeric layer may have walls that are straight, concave or convex when viewed in an elevational view. The elastomeric layer may also have defined shapes of void-free regions between the defined planes.

The elastomeric structure may also comprise a plurality of spaced elastomeric formations between the first defining plane and the second defining plane, with the voids comprising spaces between the elastomeric formations. The compressive force applied to the assembly at least partially compresses the elastomeric formations. The assembly may further include a base plate, rigid or elastomeric, wherein the elastomeric formations extend from a surface of the base plate between the first defining plane and the second defining plane. The elastomeric formations may comprise ridges extending from the base plate. The elastomeric formations may comprise discrete shapes having walls, and the shape walls may be straight, concave or convex when viewed in an elevational view.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1-12 of the drawings in which like numerals refer to like features of the invention.

Figure 1:
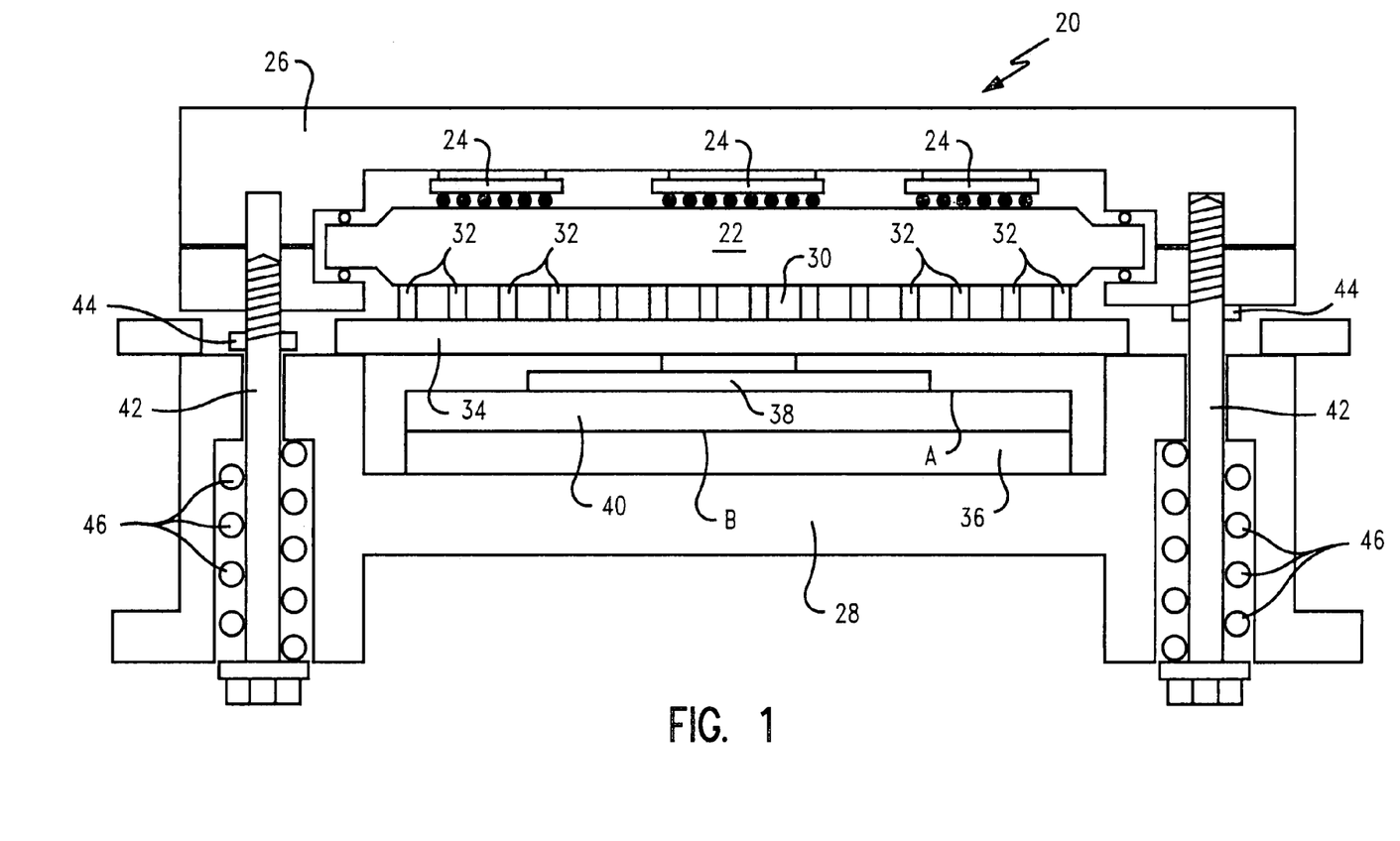
FIG. 1 is a side cross sectional view of a typical electronic module assembly utilizing an LGA connector to connect the integrated circuit chip substrate to a circuit board, and utilizing the load equalization system of the present invention.

To provide a greater range of uniform or isostatic loading of the circuit board in an electronic module assembly, and in particular to connectors utilized therewith to connect to the integrated circuit board substrate, the present invention incorporates into the electronic module assembly an elastomeric layer between the circuit board in an electronic module assembly and the base member in the electronic module assembly. FIG. 1 illustrates a typical electronic module assembly incorporating the elastomeric structure of the present invention. Module assembly 20 includes a chip connection substrate 22 on which are mounted a plurality of integrated circuit chips 24, here shown as a 3×3 array. The individual integrated circuit chips may be connected by typical connection methods (not shown) to the top surface of substrate 22. Within substrate 22, electrical connectors provide wiring to interconnects 32 in connection layer 30, here shown as an LGA connector. These connections electrically connect the integrated circuit chips to circuit board 34. Above the integrated circuit chips 24 and in thermal contact therewith is a cooling cover or top hat 26, which removes heat from the integrated circuit chips during operation thereof. Base member 28 forms the lower portion of the module, above which may include a plastic insulator layer 36 and an optional shim layer 38 such as a bulls eye tape stack. The shim layer may have additional thickness in specific desired regions to accommodate flatness or thickness non-uniformities in the stack of components, and to account for bending of base member 28 during compression of the module. Threaded fasteners 42 which are spring loaded by coil springs 46 connect the base member 28 to the top hat structure 26 to provide a compressive loading force to the stack within the assembly. Fastener stops 44 prevent over-tightening of the module.

Between the base member 28 and circuit board 34, and preferably between insulator 36 and shim 38, there is provided the elastomeric structure 40 of the present invention. This elastomeric structure is shown as a layer between defining planes A and B in contact with shim 38 and insulator 36, respectively. If the optional shim layer is not used, defining plane A is coincident with the lower surface of circuit board 34. In use with a conventional electronic module assembly of the type depicted in FIG. 1, the insulator 36 may be made thinner to accommodate the thickness of the elastomeric structure 40.

The elastomeric structure is preferably made of an elastomeric material such as silicone rubber, having a Shore A durometer of 50. Urethane rubber or foam rubber may also be used, as well as a foam rubber/fiberglass cloth/foam rubber sandwich that has deformation in the direction of the thickness, but less deflection in the directions normal to the thickness. A preferred elastomer is a silicone rubber available from Dow Corning of Midland, Mich., No. LCS 745 with peroxide cross-linking. Other elastomeric materials may be employed, preferably having a bulk durometer (Shore A scale) in the range of 25 to 70 in the direction of the thickness. For an LGA connector size of 3.6 in.×3.6 in. (9 cm×9 cm), the elastomeric structure typically has approximately the same width and length dimensions, and a thickness of approximately 0.04 inches (1.0 mm). Other thicknesses may be utilized.

Important to extending the range of elasticity during compression in the elastomeric structure is the presence of cut or molded voids to permit deformation of the elastomeric material. Such voids do not refer to the porosity formed in a foam product, but are generally larger, intentionally configured voids, preferably at least about 0.5 mm in at least one dimension.

Figure 2:
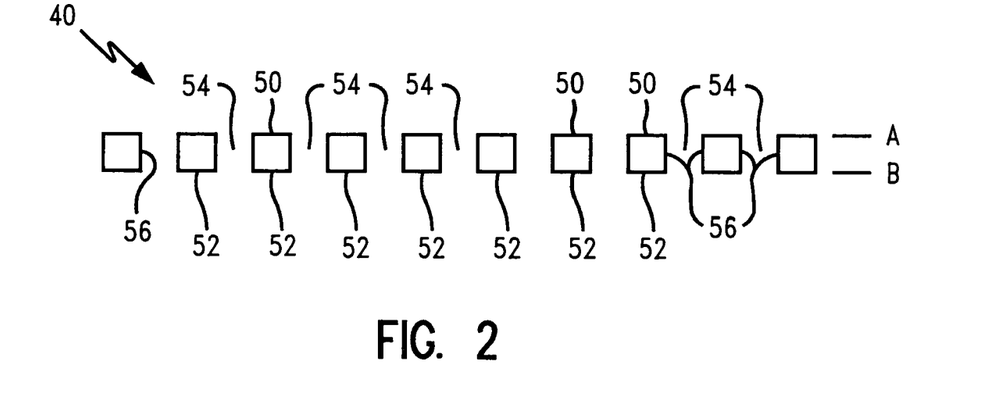
FIG. 2 is a side cross sectional view of a first embodiment of the elastomeric structure utilized in FIG. 1, with voids comprising openings therein to improve equalization the compressive loading in the electronic module assembly.
Figure 3:
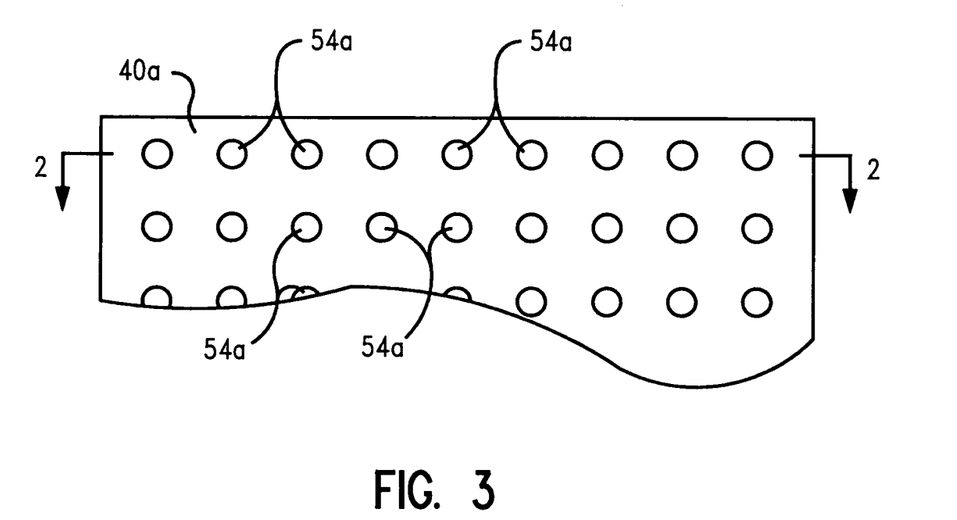
FIG. 3 is a top plan view of one modification of the elastomeric structure of FIG. 2.
Figure 4:
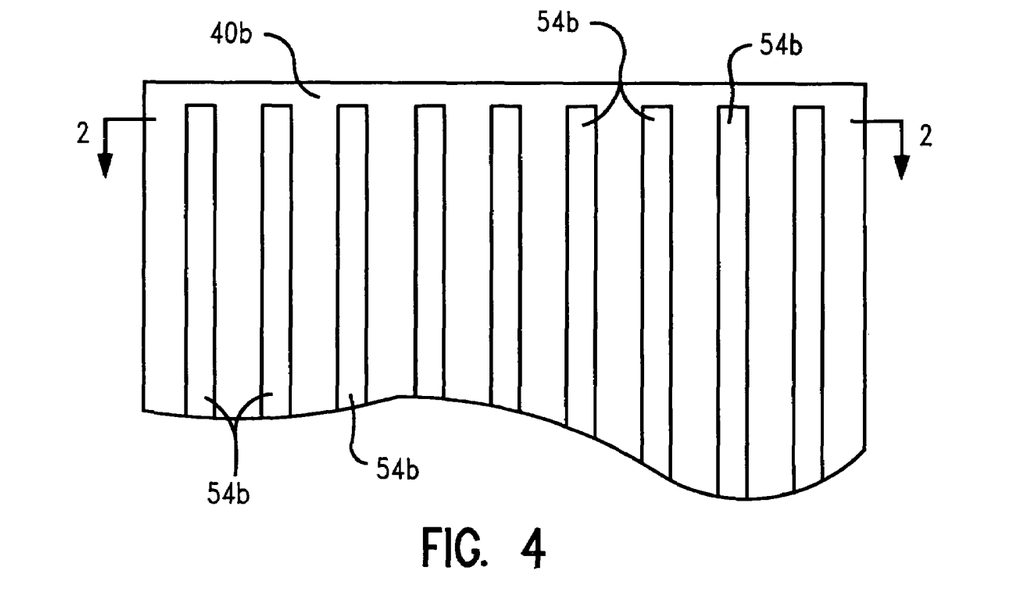
FIG. 4 is a top plan view of another modification of the elastomeric structure of FIG. 2.

A first embodiment of elastomeric structure 40 is depicted in FIGS. 2, 3 and 4. The structure of the embodiment 40 is depicted having upper and lower surfaces, 50 and 52, respectively, which coincide with planes A and B, respectively. Planes A and B define the physical limits of elastomeric structure 40 in the direction of the thickness (or z-direction), and are referred to as defining planes. These defining planes A and B do not have to be precisely planar, since they can accommodate small changes in thickness across the width or length of the structure (the x- and y-directions), but are substantially planar.

Extending through the thickness of the elastomeric layer 40 are a plurality of voids or openings 54 having side walls 56. As depicted in FIG. 3, such voids in elastomeric structure 40a are a series of spaced holes 54a extending completely through the thickness, and arranged in a grid or other array. In addition to the circular openings shown, other opening configurations may be used such as rectangles, triangles or other shapes. As depicted in FIG. 4, the voids are in the form of slots 54b extending completely through the thickness, and arranged in a parallel array along the elastomeric structure 40b. Such slots need not be parallel as shown. In both FIGS. 3 and 4, the openings have straight side walls. Other opening configurations may be employed to form the voids. The function of the voids is to permit deformation of the elastomeric material in the x- and y-directions upon application of compressive force to the layer in the z- direction. Thus as the elastomeric material is compressed, it may be deformed into the volume of the void region, thereby modifying the load/deflection relationship to permit compression over an extended range of distance and load.

Figure 5:
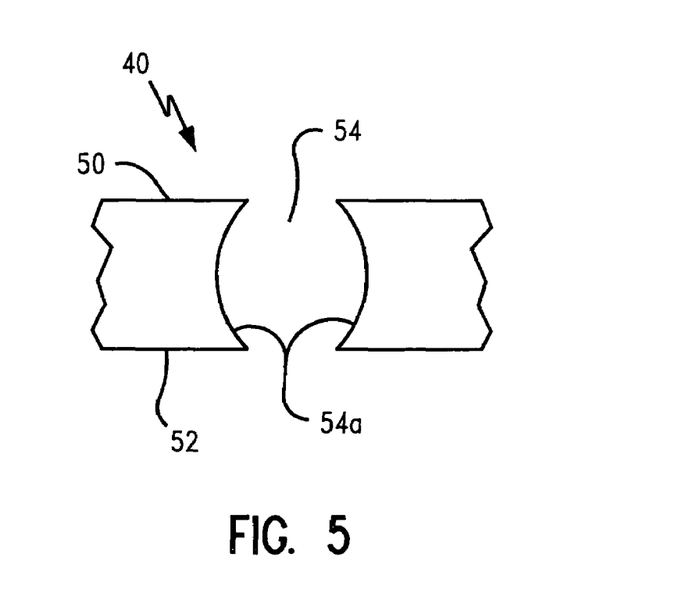
FIG. 5 is a side cross sectional view of one variation of the openings in the elastomeric structure of FIG. 2.
Figure 6:
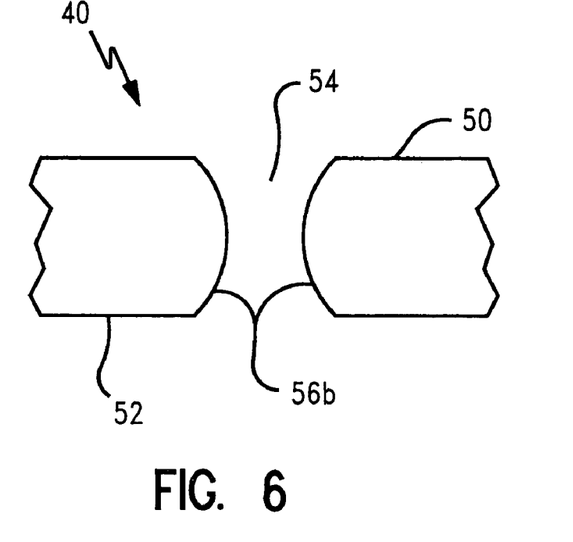
FIG. 6 is a side cross sectional view of another variation of the openings in the elastomeric structure of FIG. 2.
Figure 7:
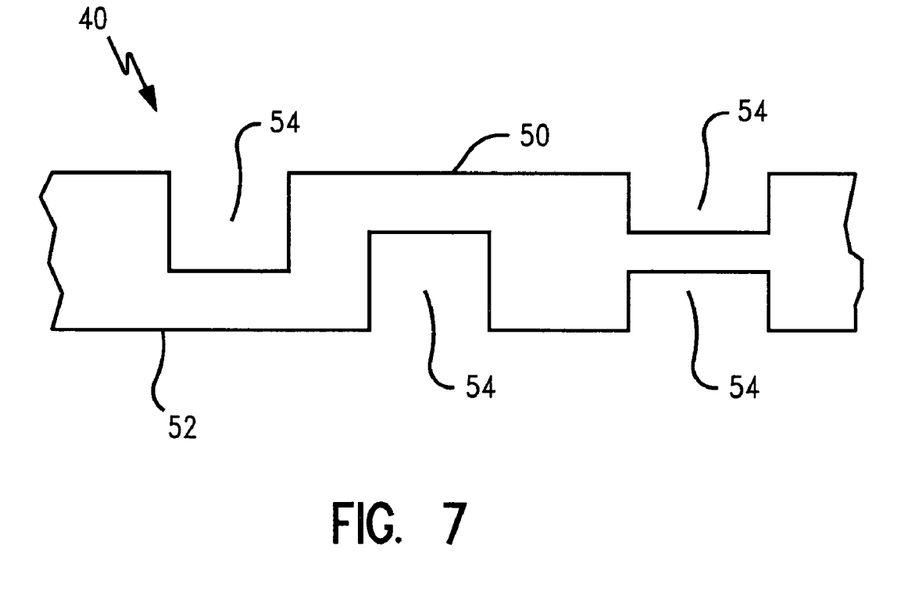
FIG. 7 is a side cross sectional view showing further embodiment of the opening configuration in the elastomeric structure of FIG. 2.

Variations of the void configuration in the elastomeric layer 40 are shown in FIGS. 5, 6, and 7. In FIG. 5, void opening 54 has concave-shaped walls 56a. In FIG. 6, the void 54 walls have a convex shape 56b. In FIG. 7, it is shown that the void or opening 54 does not need to extend completely through the layer, but may extend only partially through the thickness of layer 40 from either or both surfaces.

Figure 8:
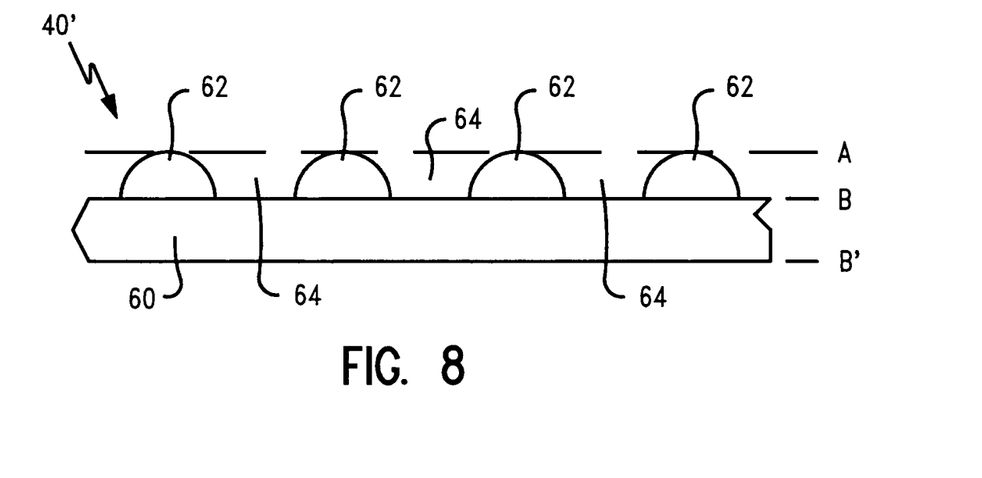
FIG. 8 is a side cross sectional view of a second embodiment of the elastomeric structure utilized in FIG. 1, with voids comprising the spaces between elastomeric formations to improve equalization the compressive loading in the electronic module assembly.
Figure 9:
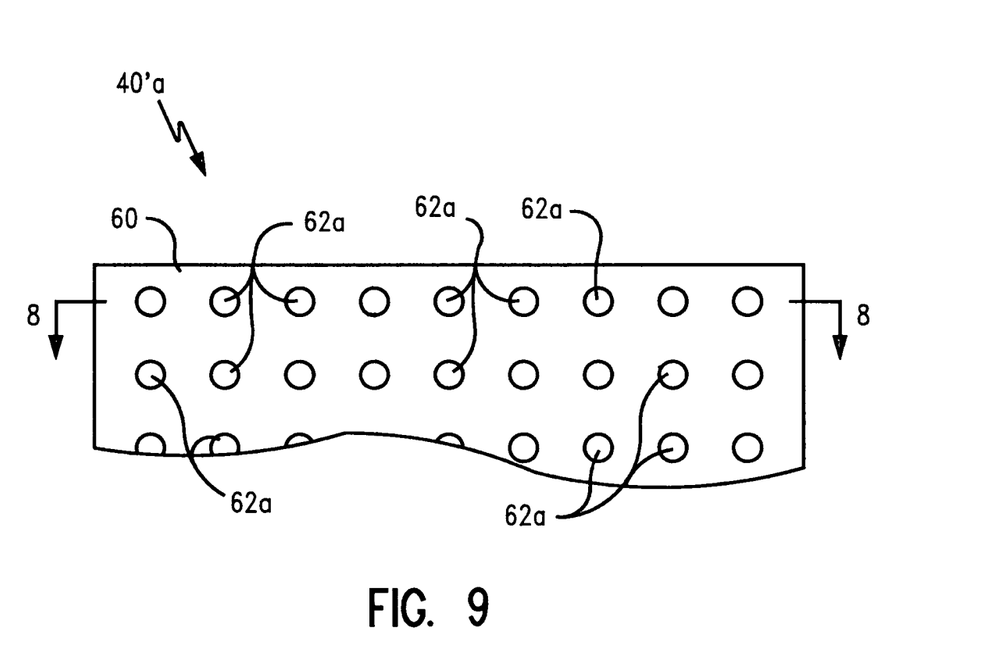
FIG. 9 is a side cross sectional view of one modification of the elastomeric structure of FIG. 8.
Figure 10:
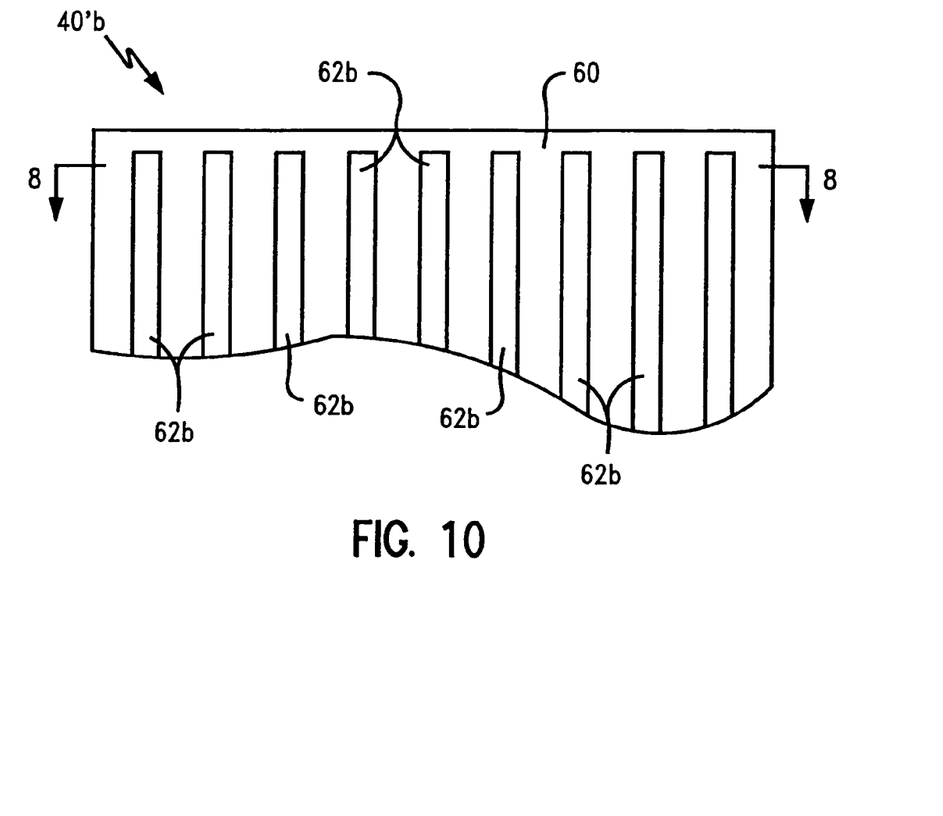
FIG. 10 is a side cross sectional view of another modification of the elastomeric structure of FIG. 8.

Another embodiment of elastomeric structure 40' is depicted in FIGS. 8, 9 and 10, where the elastomeric material comprises a series of elastomeric formations 62, shown here as mounds or bumps extending from flat layer 60. In this embodiment, the voids between defining planes A and B comprise the spaces 64 between the discrete mounds 62. As shown in FIG. 9, such mounds may comprise spaced discrete mounds 62a arranged in a grid or other array on elastomeric structure 40'a. The mounds may have the circular configurations shown, or other configurations such as rectangles, triangles and other shapes. In FIG. 10, a modification shows the mounds arranged in the form of parallel ridges 62b extending in a array across base layer 60 of elastomeric structure 40'b. Non-parallel ridges may also be used. Base layer 60 may also comprise an elastomeric material of the same or different type as mounds 62, in which case the lower surface forms a defining plane B' and the entire thickness between defining planes A and B' has elastomeric properties. Alternatively, base 60 may be a rigid material such as polyphenylene sulfide, in which case only the regions between defining planes A and B form the elastomeric structure. For example, beneficial results may be obtained by replacing a typical 4.0 mm thick polyphenylene sulfide rigid insulator in a prior art module assembly with a 3.0 to 3.5 mm thick polyphenylene sulfide rigid insulator in tandem with a 0.5 to 1.0 mm thick silicone rubber pad with any of the void configurations described above.

Figure 11:
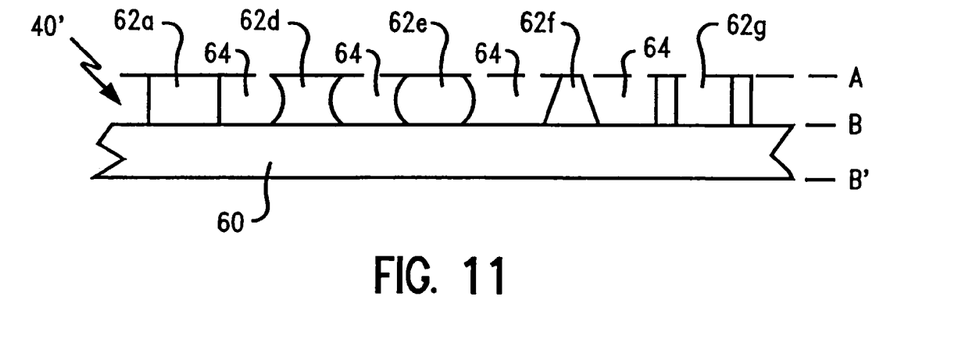
FIG. 11 is a side cross sectional view of variations of the elastomeric formations in the elastomeric structure of FIGS. 8-10.

Variations of the mound shapes of the embodiment of FIGS. 8-10 are depicted in FIG. 11. Such formations may have a cross sectional shape with straight side walls 62c, concave side walls as in shape 62d, convex side walls as in shape 62e, trapezoidal with angled side wall as in shape 62f, or as a hollow tubular shape as in shape 62g.

Figure 12:
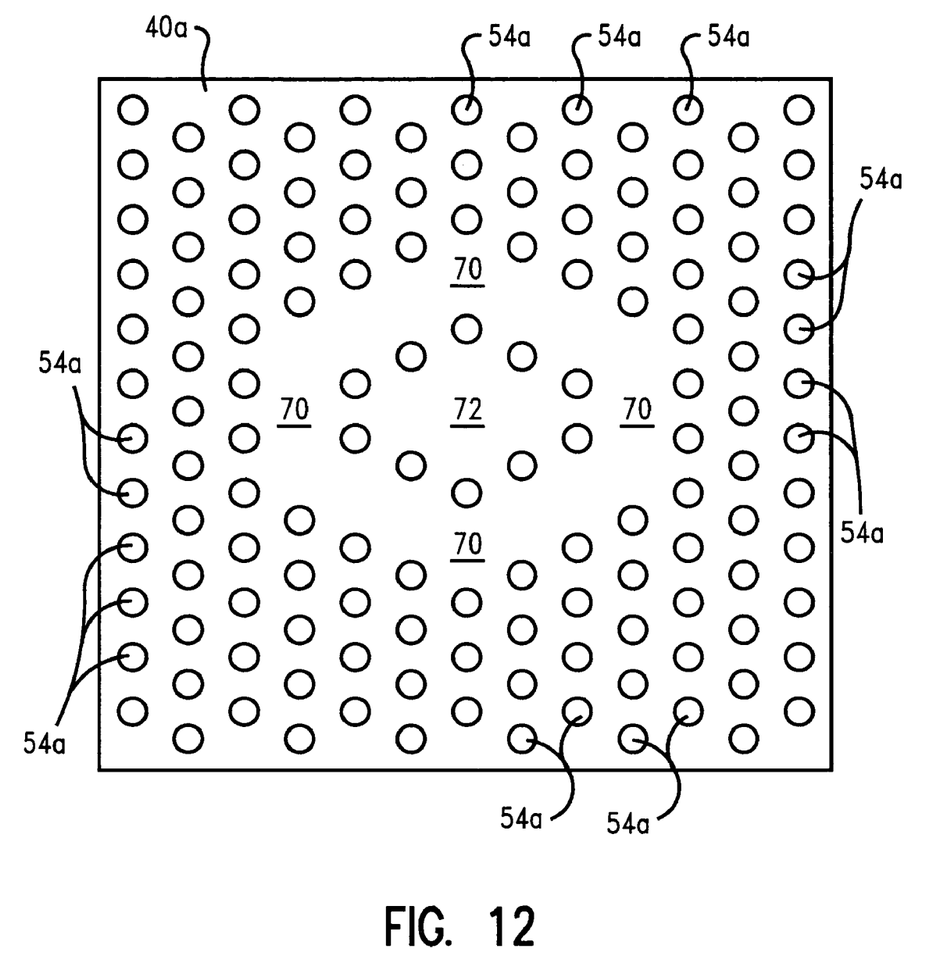
FIG. 12 is a top plan view of another embodiment of the elastomeric structure utilized in FIG. 1 that eliminates the need for the bulls eye tape stack shim.

FIG. 12 illustrates another embodiment of the elastomeric structure 40a in which annular region 70 and center region 72 are formed free of voids 54a, so that the elastic load/deflection properties of the elastomeric structure are modified in the x-y plane of the elastomeric structure. Other defined shapes of void-free regions may be used. Mounds may be substituted for some or all of the voids 54a to further modify the load/deflection properties as desired. The sizes of and density of the voids or mounds need not be uniform over the x-y plane of the elastomer, so that a tailored, non-uniform spring rate may be provided across the elastomer to provide the proper compression of the LGA connector. With this embodiment of the elastomeric structure, it is possible to eliminate the separate bulls eye tape stack shim 38 shown in FIG. 1.

The present invention therefore provides an improved method and system for load equalization on the circuit board in an existing electronic module assembly and the connections associated therewith, particularly ball grid array connectors such as LGAs. There is more uniform compression of the LGA buttons as well as the other components of the assembly stack. The minimal (most critical) button load increases, potentially allowing a lower total LGA engagement load, while peak button compression decreases. Additionally, the ceramic substrate stress decreases.

The elastomeric structure described herein also provides elasticity for load equalization in an electronic module assembly over a greater range of compression, and reduces load variation or creep after the electronic module is assembled. Any creep of the elastomeric structure in the direction of its thickness over time will only affect the load by the deformation of the spring rate, and is believed would result in a reduction of the load less than that achieved in the current configuration.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

What is claimed is:
1. An electronic module assembly comprising:
a circuit board connected to a chip substrate by an array of connectors;
a base member on the side of the circuit board away from the chip substrate and connector array; and
an elastomeric structure between the circuit board and the base member, the elastomeric structure having voids between a first defining plane adjacent the circuit board and a second defining plane adjacent the base member, the voids being free of electrical connections and adapted to permit local deformation of elastomeric material in the structure upon compression thereof a plastic insulator layer between the base member and the elastomeric structure.

2. The assembly of claim 1 wherein the elastomeric structure comprises an elastomeric layer having a first surface corresponding to the first defining plane and a second surface corresponding to the second defining plane, the voids comprising openings in at least one surface of the elastomeric layer.

3. The assembly of claim 2 wherein the openings are in both surfaces of the elastomeric layer.

4. The assembly of claim 2 wherein the openings extend only partially through the elastomeric layer.

5. The assembly of claim 2 wherein the openings comprise trenches in the at least one surface of the elastomeric layer.

6. The assembly of claim 2 wherein the openings extend completely through the elastomeric layer.

7. The assembly of claim 6 wherein the openings in the elastomeric layer have walls, and wherein the opening walls are concave when viewed in an elevational view.

8. The assembly of claim 6 wherein the openings in the elastomeric layer have walls, and wherein the opening walls are convex when viewed in an elevational view.

9. The assembly of claim 6 wherein the openings in the elastomeric layer have walls, and wherein the opening walls are essentially straight when viewed in an elevational view.

10. The assembly of claim 1 wherein the elastomeric layer has defined shapes of void-free regions between the defined planes.

11. The assembly of claim 1 wherein the elastomeric structure comprises a plurality of spaced elastomeric formations between the first defining plane and the second defining plane, the voids comprising spaces between the elastomeric formations.

12. The assembly of claim 11 further including a base plate, and wherein the elastomeric formations extend from a surface of the base plate between the first defining plane and the second defining plane.

13. The assembly of claim 12 wherein the elastomeric formations comprise discrete shapes having walls, and wherein the shape walls are concave when viewed in an elevational view.

14. The assembly of claim 12 wherein the elastomeric formations comprise discrete shapes having walls, and wherein the shape walls are convex when viewed in an elevational view.

15. The assembly of claim 12 wherein the elastomeric formations comprise discrete shapes having walls, and wherein the shape walls are essentially straight when viewed in an elevational view.

16. The assembly of claim 12 wherein the base plate is rigid.

17. The assembly of claim 12 wherein the elastomeric formations comprise ridges extending from the base plate.

18. The assembly of claim 12 wherein the base plate is elastomeric.

19. The assembly of claim 1 wherein the elastomeric structure is selected from the group consisting of silicone rubber, urethane rubber and foam rubber.

20. A method of assembling an electronic module comprising:
providing a circuit board connected to a chip substrate by an array of connectors;
providing a base member on the side of the circuit board away from the chip substrate and connector array;
placing an elastomeric structure between the circuit board and the base member, the elastomeric structure having voids between a first defining plane adjacent the circuit board and a second defining plane adjacent the base member, the voids being free of electrical connections and adapted to permit local deformation of elastomeric material in the structure placing a plastic insulator layer between the base member and the elastomeric structure; and
applying a compressive force between the circuit board and base member to at least partially compressing the elastomeric structure to improve load equalization on the circuit board.

21. The method of claim 20 wherein the elastomeric structure comprises an elastomeric layer having a first surface corresponding to the first defining plane and a second surface corresponding to the second defining plane, the voids comprising openings in at least one surface of the elastomeric layer, and wherein the compressive force at least partially compresses the elastomeric layer.

22. The method of claim 20 wherein the elastomeric structure comprises a plurality of spaced elastomeric formations extending between the first defining plane and the second defining plane, the voids comprising spaces between the elastomeric formations, and wherein the compressive force at least partially compresses the elastomeric formations.

23. The method of claim 20 wherein the elastomeric structure is selected from the group consisting of silicone rubber, urethane rubber and foam rubber.

* * * * *